United States Patent
Helmick et al.

(10) Patent No.: US 11,055,176 B1
(45) Date of Patent: Jul. 6, 2021

(54) STORAGE DEVICES HIDING PARITY SWAPPING BEHAVIOR

(71) Applicant: Western Digital Technologies, Inc., San Jose, CA (US)

(72) Inventors: Daniel L. Helmick, Broomfield, CO (US); Peter Grayson, Grand Rapids, MI (US); Sergey Anatolievich Gorobets, Edinburgh (GB)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/858,356

(22) Filed: Apr. 24, 2020

(51) Int. Cl.
*G06F 11/10* (2006.01)
*G06F 3/06* (2006.01)
*G11C 11/00* (2006.01)

(52) U.S. Cl.
CPC .......... *G06F 11/1076* (2013.01); *G06F 3/068* (2013.01); *G06F 3/0619* (2013.01); *G06F 3/0659* (2013.01); *G11C 11/005* (2013.01)

(58) Field of Classification Search
CPC .... G06F 3/0619; G06F 3/0659; G06F 11/108; G06F 11/1076; G06F 12/0246
See application file for complete search history.

(56) References Cited

U.S. PATENT DOCUMENTS

| | | | |
|---|---|---|---|
| 2008/0229169 A1 | 9/2008 | Naritomi et al. | |
| 2009/0248964 A1* | 10/2009 | Yano | G06F 12/0246 711/103 |
| 2009/0319840 A1 | 12/2009 | Hara et al. | |
| 2015/0043277 A1 | 2/2015 | Fitzpatrick et al. | |
| 2017/0123944 A1* | 5/2017 | Macko | G06F 11/1076 |
| 2017/0351572 A1* | 12/2017 | Singhai | G06F 11/108 |
| 2019/0129793 A1 | 5/2019 | Choi et al. | |

FOREIGN PATENT DOCUMENTS

EP 0542417 A1 5/1993

OTHER PUBLICATIONS

International Search Report and the Written Opinion for International Application No. PCT/US2020/064910 dated Mar. 18, 2021, 12 pages.

* cited by examiner

*Primary Examiner* — Shelly A Chase
(74) *Attorney, Agent, or Firm* — Patterson & Sheridan, LLP; Steven H. Versteeg

(57) ABSTRACT

The present disclosure generally relates to methods of operating storage devices. The storage device comprises a controller comprising first random access memory (RAM1), second random access memory (RAM2), and a storage unit divided into a plurality of zones. By restricting the host to have a minimum write size, the data transfer speed to RAM2, RAM1, and the storage unit can be optimized. A temporary buffer is utilized within the RAM1 to update parity data for the corresponding commands. The parity data is updated in the RAM1 and written to the RAM2 in the corresponding zone. The parity data may be copied from the RAM2 to the RAM1 to update the parity data in the temporary buffer when commands are received to write data to corresponding zones. As the parity data is updated, the corresponding command is simultaneously written to the corresponding zone.

20 Claims, 10 Drawing Sheets

STORAGE DEVICES HIDING PARITY SWAPPING BEHAVIOR

BACKGROUND OF THE DISCLOSURE

Field of the Disclosure

Embodiments of the present disclosure generally relate to storage devices, such as sold state drives (SSDs).

Description of the Related Art

Storage devices, such as SSDs, may be used in computers in applications where relatively low latency and high capacity storage are desired. For example, SSDs may exhibit lower latency, particularly for random reads and writes, than hard disk drives (HDDs). Typically, a controller of the SSD receives a command to read or write data from a host device to a memory device. The data is read and written to one or more erase blocks in the memory device. Each of the erase blocks is associated with a logical block address so that the SSD and/or the host device know the location of where the data is stored. One or more erase blocks may be grouped together by their respective logical block addresses to form a plurality of zones.

Typically, one die in each zone is dedicated to storing parity data, such as XOR data, for the zone. As a command is received by the storage device to write data to a particular zone, the data associated with the command is written to the memory device, and parity data is simultaneously generated for the data in order to protect the data. The parity data is then stored in random-access memory (RAM) within the storage device. However, the storage device generally comprises a very limited amount of RAM, as RAM is expensive from cost and total system design perspective. Since parity data is generated for each write command received, the parity data takes up a lot of the valuable RAM space, which may reduce the amount of RAM space available for other data, or may require a greater amount of RAM to be included in the storage device. Furthermore, a data transfer to the NAND is slower than a data transfer to SRAM or to DRAM. Since the data transfer speed to the NAND may be the limiting factor, numerous small commands may cause a bottleneck to occur while writing the data to the NAND and simultaneously generating or updating the corresponding parity data. Thus, the overall cost of the storage device may be increased, or the capabilities of the storage device may be limited.

Therefore, what is needed is a new method of generating and storing parity data in a storage device.

SUMMARY OF THE DISCLOSURE

The present disclosure generally relates to methods of operating storage devices. The storage device comprises a controller comprising first random access memory (RAM1), second random access memory (RAM2), and a storage unit divided into a plurality of zones. By restricting the host to have a minimum write size, the data transfer speed to RAM2, RAM1, and the storage unit can be optimized. A temporary buffer is utilized within the RAM1 to update parity data for the corresponding commands. The parity data is updated in the RAM1 and written to the RAM2 in the corresponding zone. The parity data may be copied from the RAM2 to the RAM1 to update the parity data in the temporary buffer when commands are received to write data to corresponding zones. As the parity data is updated, the corresponding command is simultaneously written to the corresponding zone.

In one embodiment, a storage device comprises a non-volatile storage unit. The capacity of the non-volatile storage unit is divided into a plurality of zones. The non-volatile storage unit comprises a plurality of dies, each of the plurality of dies comprises a plurality of erase blocks. The storage device further comprises a first volatile memory unit, a controller coupled to the non-volatile storage unit and the first volatile memory unit, and a controller comprising a second volatile memory unit. The controller is configured to set a minimum write size for commands to write data received from a host device and receive one or more commands to write data in the minimum write size to one or more zones of the plurality of zones. The controller is further configured to generate new first parity data for a first zone of the plurality of zones in a temporary location in the second volatile memory unit and copy previous first parity data for the first zone from the first volatile memory unit to a first location in the second volatile memory unit. The controller is further configured to update the previous first parity data with the new first parity data in the second volatile memory unit.

In another embodiment, a storage device comprises a non-volatile storage unit. The capacity of the non-volatile storage unit is divided into a plurality of zones. The non-volatile storage unit comprises a plurality of dies, each of the plurality of dies comprises a plurality of erase blocks. The storage device further comprises a first volatile memory unit, a controller coupled to the non-volatile storage unit and the first volatile memory unit, and a controller comprising a second volatile memory unit. The controller is configured to receive a first command to write data in a minimum write size to a first zone of the plurality of zones, and simultaneously, generate new first parity data for the first zone in a temporary location in the second volatile memory unit, where the new first parity data is associated with the first command, write the data associated with the first command to the first zone, and copy previous first parity data for the first zone from the first volatile memory unit to a first location in the second volatile memory unit. The controller is also configured to update the previous first parity data with the new first parity data in the first location in the second volatile memory unit, erase the temporary location in the second volatile memory unit. The controller is further configured to receive a second command to write data in the minimum write size to a second zone, and simultaneously, generate new second parity data for the second zone in the temporary location in the second volatile memory unit, where the new second parity data is associated with the second command, write the data associated with the second command to the second zone, and copy previous second parity data for the second zone from the first volatile memory unit to a second location in the second volatile memory unit. The controller is also configured to update the previous second parity data with the new second parity data in the temporary location in the second volatile memory unit.

In another embodiment, a storage device comprises a non-volatile unit, wherein the capacity of the non-volatile storage unit is divided into a plurality of zones. The non-volatile unit comprises a plurality of dies and each of the plurality of dies comprises a plurality of erase blocks. The storage device further comprises a DRAM unit, a controller coupled to the non-volatile unit and the DRAM unit, and a controller comprising a SRAM unit. The controller is configured to receive one or more commands to write data to one or more zones of the plurality of zones, wherein the data associated with the one or more commands are restricted to a minimum write size. The controller is also configured to generate new first parity data for a first zone in a temporary location in the SRAM unit, where the new first parity data is associated with a first command received in the minimum write size, and write the data associated with the first command to the first zone simultaneously. The controller is further configured to erase a first location in the SRAM unit, copy previous first parity data for the first zone from the DRAM unit to the first location in the SRAM unit, and combine the previous first parity data with the new first parity data in the SRAM unit. The controller is also configured to copy the combined first parity data from the SRAM unit to a first location in the DRAM unit. The minimum write size is rate matched to a program time of writing the data associated with the one or more commands to the one or more zones, a transfer speed for copying previous parity data from the DRAM unit to the SRAM unit, or an amount of time it takes to generate new parity data.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to methods of operating storage devices. The storage device comprises a controller comprising first random access memory (RAM1), second random access memory (RAM2), and a storage unit divided into a plurality of zones. By restricting the host to have a minimum write size, the data transfer speed to RAM2, RAM1, and the storage unit can be optimized. A temporary buffer is utilized within the RAM1 to update parity data for the corresponding commands. The parity data is updated in the RAM1 and written to the RAM2 in the corresponding zone. The parity data may be copied from the RAM2 to the RAM1 to update the parity data in the temporary buffer when commands are received to write data to corresponding zones. As the parity data is updated, the corresponding command is simultaneously written to the corresponding zone.

Figure 1:
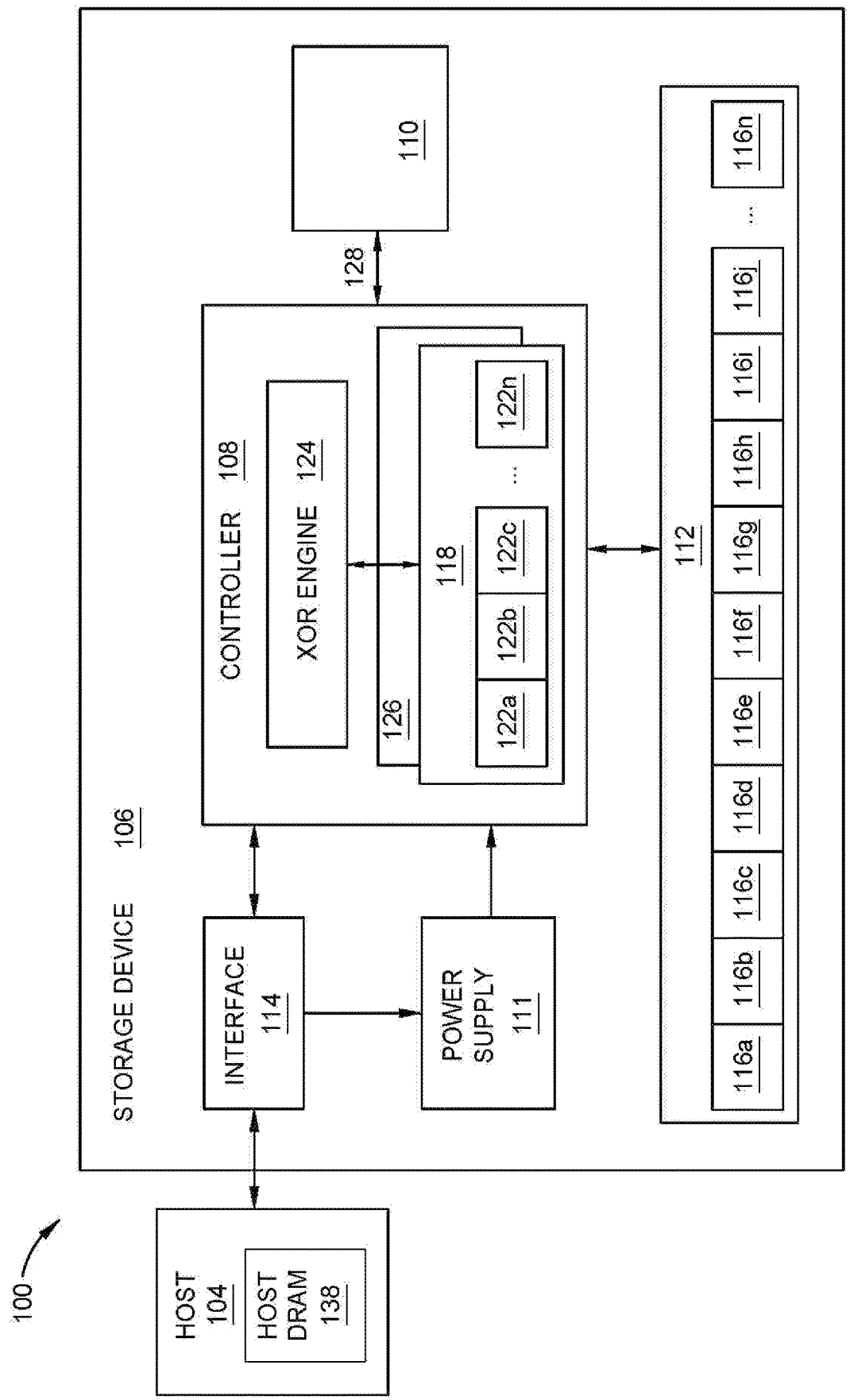
FIG. 1 is a schematic block diagram illustrating a storage system, according to one embodiment.

FIG. 1 is a schematic block diagram illustrating a storage system 100 in which storage device 106 may function as a storage device for a host device 104, in accordance with one or more techniques of this disclosure. For instance, the host device 104 may utilize a storage unit 110, such as non-volatile memory (NVM), included in storage device 106 to store and retrieve data. The storage unit 110 may be any type of non-volatile memory, such as MRAM, NAND, NOR, or HDD, for example. In the following descriptions, the storage unit 110 is referenced as a non-volatile memory (NVM) 110 for simplification and exemplary purposes. The host device 104 comprises a host DRAM 138. In some examples, the storage system 100 may include a plurality of storage devices, such as the storage device 106, which may operate as a storage array. For instance, the storage system 100 may include a plurality of storages devices 106 configured as a redundant array of inexpensive/independent disks (RAID) that collectively function as a mass storage device for the host device 104.

The storage system 100 includes a host device 104 which may store and/or retrieve data to and/or from one or more storage devices, such as the storage device 106. As illustrated in FIG. 1, the host device 104 may communicate with the storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

The storage device 106 includes a controller 108, NVM 110, a power supply 111, a first random-access memory (RAM) or volatile memory 112, such as a dynamic random-access memory (DRAM), and an interface 114. The controller 108 may comprise a parity engine or a XOR engine 124 and a second RAM or volatile memory 118, such as a static random-access memory (SRAM). In the following descriptions, a first RAM or volatile memory 112 is referenced to as DRAM and a second RAM or volatile memory 118 is referenced as SRAM for simplification and exemplary purposes. In some examples, the storage device 106 may include additional components not shown in FIG. 1 for sake of clarity. For example, the storage device 106 may include a printed circuit board (PCB) to which components of the storage device 106 are mechanically attached and which includes electrically conductive traces that electrically interconnect components of the storage device 106, or the like. In some examples, the physical dimensions and connector configurations of the storage device 106 may conform to one or more standard form factors. Some example standard form factors include, but are not limited to, 2.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the storage device 106 may be directly coupled (e.g., directly soldered) to a motherboard of the host device 104.

The interface 114 of the storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, PCIe, non-volatile memory express (NVMe), OpenCAPI, GenZ, Cache Coherent Interface Accelerator (CCIX), Compute Express Link (CXL), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the storage device 106 to receive power from the host device 104. For example, as illustrated in FIG. 1, the power supply 111 may receive power from the host device 104 via the interface 114.

The storage device 106 includes NVM 110, which may include a plurality of memory devices. NVM 110 may be configured to store and/or retrieve data. For instance, a memory device of NVM 110 may receive data and a message from the controller 108 that instructs the memory device to store the data. Similarly, the memory device of NVM 110 may receive a message from the controller 108 that instructs the memory device to retrieve data. In some examples, each of the memory devices may be referred to as a die. In some examples, a single physical chip may include a plurality of dies (i.e., a plurality of memory devices). In some examples, each of the memory devices may be configured to store relatively large amounts of data (e.g., 128 MB, 256 MB, 412 MB, 1 GB, 2 GB, 3 GB, 8 GB, 16 GB, 22 GB, 54 GB, 128 GB, 256 GB, 412 GB, 1 TB, etc.).

In some examples, each memory device of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, hard disk drives (HDD), and any other type of non-volatile memory devices.

The NVM 110 may comprise a plurality of flash memory devices. Flash memory devices may include NAND or NOR based flash memory devices, and may store data based on a charge contained in a floating gate of a transistor for each flash memory cell. In NAND flash memory devices, the flash memory device may be divided into a plurality of blocks which may divided into a plurality of pages. Each block of the plurality of blocks within a particular memory device may include a plurality of NAND cells. Rows of NAND cells may be electrically connected using a wordline to define a page of a plurality of pages. Respective cells in each of the plurality of pages may be electrically connected to respective bit lines. Furthermore, NAND flash memory devices may be 2D or 3D devices, and may be single level cell (SLC), multi-level cell (MLC), triple level cell (TLC), quad level cell (QLC), or other higher iterations of level cell. The controller 108 may write data to and read data from NAND flash memory devices at the page level and erase data from NAND flash memory devices at the block level.

A portion of the NVM 110 may be formatted into logical blocks such that a capacity of the NVM 110 is divided into a plurality of zones. Each of the zones comprise a plurality of physical or erase blocks of the NVM 110, and each of the erase blocks are associated a plurality of logical blocks. Each of the logical blocks is associated with a unique LBA or sector. Each of the zones may have a size aligned to the capacity of one or more erase blocks of the NVM 110. When the controller 108 receives a command, such as from a host device 104, the controller 108 can read data from and write data to the plurality of logical blocks associated with the plurality of erase blocks of the NVM 110.

The storage device 106 includes a power supply 111, which may provide power to one or more components of the storage device 106. When operating in a standard mode, the power supply 111 may provide power to the one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The storage device 106 also includes volatile memory, which may be used by controller 108 to store information. Volatile memory may be comprised of one or more volatile memory devices. In some examples, the controller 108 may use volatile memory as a cache. For instance, the controller 108 may store cached information in volatile memory until cached information is written to the NVM 110. Examples of volatile memory 112 include, but are not limited to, RAM, DRAM 112, SRAM 118, and synchronous dynamic RAM (SDRAM (e.g., DDR1, DDR2, DDR3, DDR3L, LPDDR3, DDR4, LPDDR4, DDR5, LPDDR5, and the like)). As illustrated in FIG. 1, volatile memory may consume power received from the power supply 111.

The various types of volatile memories may be used with different access properties. For example, DRAM 112 may be arranged for longer burst accesses to allow for improved bandwidth (BW) of the same access bus. Alternatively, DRAM 112 may be used with smaller accesses such that random small accesses may have better latency. The controller 108 comprises additional optional SRAM and/or embedded MRAM 126. Embedded MRAM 126 is another alternative memory that may be used in another embodiment. Similarly, the access to the MRAM 126 can be optimized for different design purposes, but the quantity of embedded MRAM 126 in the SSD controller 108 may be cost sensitive. Therefore, the choice of how much data and which data goes into the premium non-volatile memory and premium volatile memory will subject to system tradeoffs.

The storage device 106 includes a controller 108, which may manage one or more operations of the storage device 106. For instance, the controller 108 may manage the reading of data from and/or the writing of data to the NVM 110 via a toggle mode (TM) bus 128. The controller 108 may comprise of an XOR engine 124. The data may be stored in either DRAM 112, SRAM 118, or both DRAM 112 and SRAM 118. In some embodiments, when the storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110.

The controller 108 may include a XOR engine 124 with logic and/or features to generate XOR parity information. The XOR engine 124 is a type of parity engine and is called out as a XOR engine for exemplary purposes. However, the XOR engine 124 may include other embodiments that the parity engine comprises. Exclusive OR (XOR) parity information may be used to improve reliability of storage device 106, such as enabling data recovery of failed writes or failed reads of data to and from NVM or enabling data recovery in case of power loss. The reliability may be provided by using XOR parity information generated or computed based on data stored to storage device 106. Data may pass through the XOR engine 124 to be written to the NVM 110. The XOR engine 124 may generate a parity stream to be written to the SRAM 118. The SRAM 118 and the DRAM 112 may each contain a plurality of regions which data may be written to. Data may be transferred from an SRAM region 122a-122n in the SRAM 118 to a DRAM region 116a-116n in the DRAM 112, and vice-versa.

The SRAM device 118 and the DRAM device 112 each individually comprises one or more dies. Each of the one or more dies comprises one or more ranks which is comprised of one or more banks. The banks are composed of rows and pages. The SRAM 118 in the controller 108 may be logically or physical separated into different SRAM areas or regions 122a-122n for use by the controller 108. Similarly, the DRAM 112 may be logically or physical separated into different DRAM areas or regions 116a-116n for use by the controller 108. The MRAM inside of the controller 108 may be logically or physical separated into different MRAM areas or regions (not shown). External attachments of MRAM often have a vendor specific structure and access not covered here.

Figure 2:
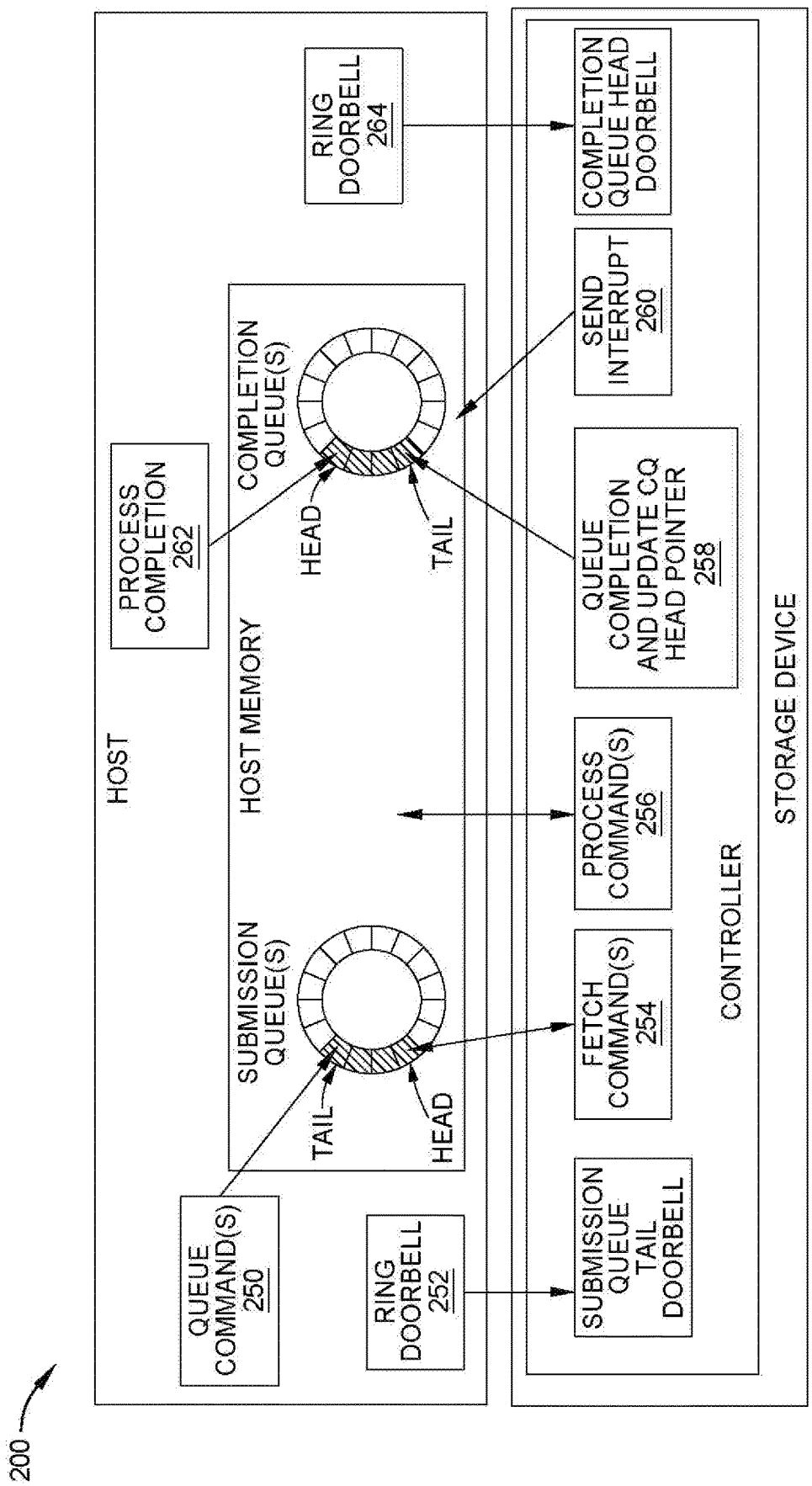
FIG. 2 is a block diagram illustrating a method of operating a storage device to execute a read or write command, according to one embodiment.

FIG. 2 is a block diagram illustrating a method 200 of operating a storage device to execute a read or write command, according to one embodiment. Method 200 may be used with the storage system 100 having a host device 104 and a storage device 106 comprising a controller 108. Method 200 may be used with the device a host device and a storage device comprising a command processor.

Method 200 begins at operation 250, where the host device writes a command into a submission queue as an entry. The host device may write one or more commands into the submission queue at operation 250. The commands may be read commands or write commands. The host device may comprise one or more submission queues. The host device may write one or more commands to the submission queue in any order (i.e., a submission order), regardless of the sequential write order of the one or more commands (i.e., a sequential processing order).

In operation 252, the host device writes one or more updated submission queue tail pointers and rings a doorbell or sends an interrupt signal to notify or signal the storage device of the new command that is ready to be executed. The host may write an updated submission queue tail pointer and send a doorbell or interrupt signal for each of the submission queues if there are more than one submission queues. In operation 254, in response to receiving the doorbell or interrupt signal, a controller of the storage device fetches the command from the one or more submission queue, and the controller receives or DMA reads the command.

In operation 256, the controller processes the command and writes or transfers data associated with the command to the host device memory. The controller may process more than one command at a time. The controller may process one or more commands in the submission order or in the sequential order. Processing a write command may comprise identifying a zone to write the data associated with the command to, writing the data to one or more logical block addresses (LBAs) of the zone, and advancing a write pointer of the zone to identify the next available LBA within the zone.

In operation 258, once the command has been fully processed, the controller writes a completion entry corresponding to the executed command to a completion queue of the host device and moves or updates the CQ head pointer to point to the newly written completion entry.

In operation 260, the controller generates and sends an interrupt signal or doorbell to the host device. The interrupt signal indicates that the command has been executed and data associated with the command is available in the memory device. The interrupt signal further notifies the host device that the completion queue is ready to be read or processed.

In operation 262, the host device processes the completion entry. In operation 264, the host device writes an updated CQ head pointer to the storage device and rings the doorbell or sends an interrupt signal to the storage device to release the completion entry.

Figure 3A:
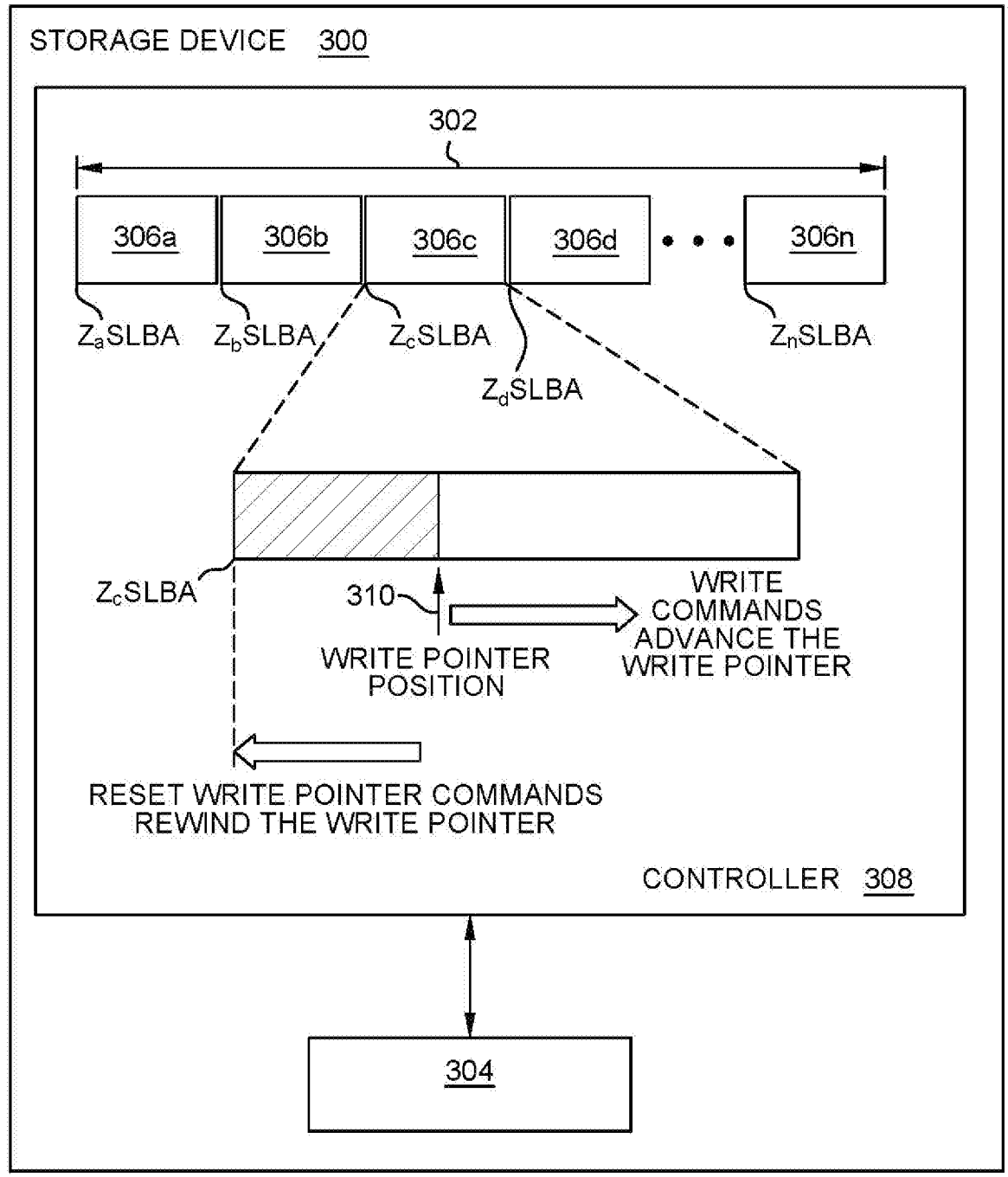
FIG. 3A illustrates a zoned namespaces utilized in a storage device, according to one embodiment.
Figure 3B:
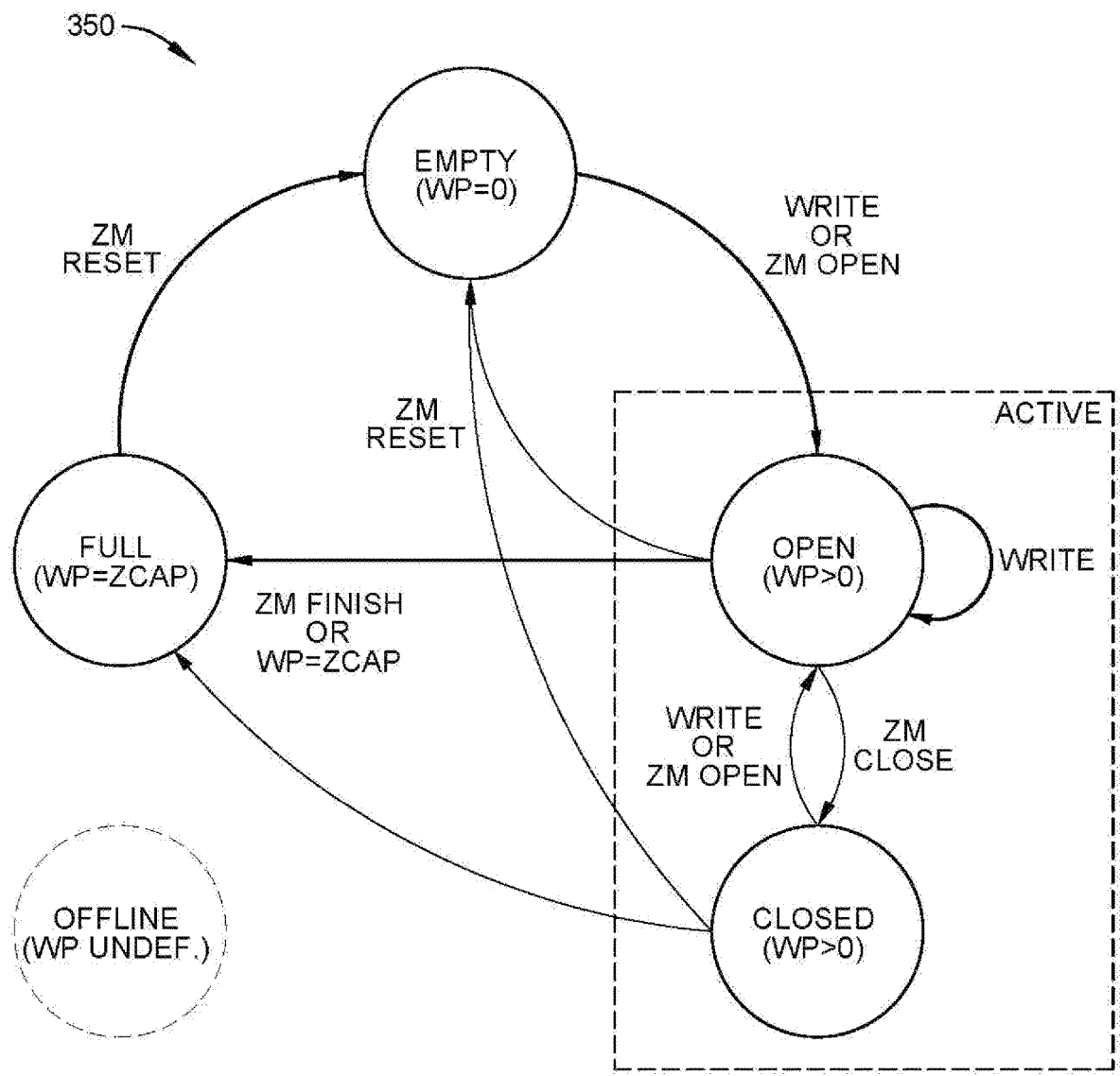
FIG. 3B illustrates a state diagram for the zoned namespaces of the storage device of FIG. 3A, according to one embodiment.

FIG. 3A illustrates a Zoned Namespaces (ZNS) 302 view utilized in a storage device 300, according to one embodiment. The storage device 300 may present the ZNS 302 view to a host device. FIG. 3B illustrates a state diagram 350 for the ZNS 302 of the storage device 300, according to one embodiment. The storage device 300 may be the storage device 106 of the storage system 100 of FIG. 1. The storage device 300 may have one or more ZNS 302, and each ZNS 302 may be different sizes. The storage device 300 may further comprise one or more conventional namespaces in addition to the one or more Zoned Namespaces 302. Moreover, the ZNS 302 may be a zoned block command (ZBC) for SAS and/or a zoned-device ATA command set (ZAC) for SATA. Host side zone activity may be more directly related to media activity in zoned drives due to the relationship of logical to physical activity possible.

In the storage device 300, the ZNS 302 is the quantity of NVM that can be formatted into logical blocks such that the capacity is divided into a plurality of zones 306a-306n (collectively referred to as zones 306). The NVM may be the storage unit or NVM 110 of FIG. 1. Each of the zones 306 comprise a plurality of physical or erase blocks (not shown) of a memory unit or NVM 304, and each of the erase blocks are associated a plurality of logical blocks (not shown). Each of the zones 306 may have a size aligned to the capacity of one or more erase blocks of a NVM or NAND device. When the controller 308 receives a command, such as from a host device (not shown) or the submission queue of a host device, the controller 308 can read data from and write data to the plurality of logical blocks associated with the plurality of erase blocks (EBs) of the ZNS 302. Each of the logical blocks is associated with a unique LBA or sector.

In one embodiment, the NVM 304 is a NAND device. The NAND device comprises one or more dies. Each of the one or more dies comprises one or more planes. Each of the one or more planes comprises one or more erase blocks. Each of the one or more erase blocks comprises one or more wordlines (e.g., 256 wordlines). Each of the one or more wordlines may be addressed in one or more pages. For example, an MLC NAND die may use upper page and lower page to reach the two bits in each cell of the full wordline (e.g., 16 kB per page). Furthermore, each page can be accessed at a granularity equal to or smaller than the full page. A controller can frequently access NAND in user data granularity LBA sizes of 512 bytes. Thus, as referred to in the below description, NAND locations are equal to a granularity of 512 bytes. As such, an LBA size of 512 bytes and a page size of 16 KiB for two pages of an MLC NAND results in 32 LBAs per wordline. However, the NAND location size is not intended to be limiting, and is merely used as an example.

When data is written to an erase block, one or more logical blocks are correspondingly updated within a zone 306 to track where the data is located within the NVM 304. Data may be written to one zone 306 at a time until a zone 306 is full, or to multiple zones 306 such that multiple zones 306 may be partially full. Similarly, when writing data to a particular zone 306, data may be written to the plurality of erase blocks one block at a time, in sequential order of NAND locations or wordline-by-wordline, until moving to an adjacent block (i.e., write to a first erase block until the first erase block is full before moving to the second erase block), or to multiple blocks at once, in sequential order of NAND locations or wordline-by-wordline, to partially fill each block in a parallel fashion (i.e., writing the first NAND location of each erase block before writing to the second NAND location of each erase block). This sequential programming of every NAND location is a typical non-limiting requirement of many NAND EBs.

When a controller 308 selects the erase blocks that will store the data for each zone, the controller 308 will be able to choose the erase blocks either at the zone open time, or it may choose the erase blocks as it reaches a need to fill the first NAND location or wordline of that particular erase block. This may be more differentiating when the above described method of filling one erase block completely prior to starting the next erase block is utilized. The controller 308 may use the time difference to select a more optimal erase block in a just-in-time basis. The decision of which erase block is allocated and assigned for each zone and its contiguous LBAs can be occurring for zero or more concurrent zones at all times within the controller 308.

Each of the zones 306 is associated with a zone starting logical block address (ZSLBA) or zone starting sector. The ZSLBA is the first available LBA in the zone 306. For example, the first zone 306a is associated with $Z_a$SLBA, the second zone 306b is associated with $Z_b$SLBA, the third zone 306c is associated with $Z_c$SLBA, the fourth zone 306d is associated with $Z_d$SLBA, and the $n^{th}$ zone 306n (i.e., the last zone) is associated with $Z_n$SLBA. Each zone 306 is identified by its ZSLBA, and is configured to receive sequential writes (i.e., writing data to the NVM 110 in the order the write commands are received).

As data is written to a zone 306, a write pointer 310 is advanced or updated to point to or to indicate the next available block in the zone 306 to write data to in order to track the next write starting point (i.e., the completion point of the prior write equals the starting point of a subsequent write). Thus, the write pointer 310 indicates where the subsequent write to the zone 306 will begin. Subsequent write commands are 'zone append' commands, where the data associated with the subsequent write command appends to the zone 306 at the location the write pointer 310 is indicating as the next starting point. An ordered list of LBAs within the zone 306 may be stored for write ordering. Each zone 306 may have its own write pointer 310. Thus, when a write command is received, a zone is identified by its ZSLBA, and the write pointer 310 determines where the write of the data begins within the identified zone.

FIG. 3B illustrates a state diagram 350 for the ZNS 302 of FIG. 3A. In the state diagram 350, each zone may be in a different state, such as empty, active, full, or offline. When a zone is empty, the zone is free of data (i.e., none of the erase blocks in the zone are currently storing data) and the write pointer is at the ZSLBA (i.e., WP=0). An empty zone switches to an open and active zone once a write is scheduled to the zone or if the zone open command is issued by the host. Zone management (ZM) commands can be used to move a zone between zone open and zone closed states, which are both active states. If a zone is active, the zone comprises open blocks that may be written to, and the host may be provided a description of recommended time in the active state. The controller 308 comprises the ZM. Zone metadata may be stored in the ZM and/or the controller 308.

The term "written to" includes programming user data on 0 or more NAND locations in an erase block and/or partially filled NAND locations in an erase block when user data has not filled all of the available NAND locations. The term "written to" may further include moving a zone to full due to internal drive handling needs (open block data retention concerns because the bits in error accumulate more quickly on open erase blocks), the storage device 300 closing or filling a zone due to resource constraints, like too many open zones to track or discovered defect state, among others, or a host device closing the zone for concerns such as there being no more data to send the drive, computer shutdown, error handling on the host, limited host resources for tracking, among others.

The active zones may be either open or closed. An open zone is an empty or partially full zone that is ready to be written to and has resources currently allocated. The data received from the host device with a write command or zone append command may be programmed to an open erase block that is not currently filled with prior data. A closed zone is an empty or partially full zone that is not currently receiving writes from the host in an ongoing basis. The movement of a zone from an open state to a closed state allows the controller 308 to reallocate resources to other tasks. These tasks may include, but are not limited to, other zones that are open, other conventional non-zone regions, or other controller needs.

In both the open and closed zones, the write pointer is pointing to a place in the zone somewhere between the ZSLBA and the end of the last LBA of the zone (i.e., WP>0). Active zones may switch between the open and closed states per designation by the ZM, or if a write is scheduled to the zone. Additionally, the ZM may reset an active zone to clear or erase the data stored in the zone such that the zone switches back to an empty zone. Once an active zone is full, the zone switches to the full state. A full zone is one that is completely filled with data, and has no more available sectors or LBAs to write data to (i.e., WP=zone capacity (ZCAP)). In a full zone, the write pointer points to the end of the writeable capacity of the zone. Read commands of data stored in full zones may still be executed.

The zones may have any total capacity, such as 256 MiB or 512 MiB. However, a small portion of each zone may be inaccessible to write data to, but may still be read, such as a portion of each zone storing the XOR data and one or more excluded erase blocks. For example, if the total capacity of a zone 306 is 512 MiB, the ZCAP may be 470 MiB, which is the capacity available to write data to, while 42 MiB are unavailable to write data. The writeable capacity (ZCAP) of a zone is equal to or less than the total zone storage capacity. The storage device 300 may determine the ZCAP of each zone upon zone reset. For example, the controller 308 or the ZM may determine the ZCAP of each zone. The storage device 300 may determine the ZCAP of a zone when the zone is reset.

The ZM may reset a full zone, scheduling an erasure of the data stored in the zone such that the zone switches back to an empty zone. When a full zone is reset, the zone may not be immediately cleared of data, though the zone may be marked as an empty zone ready to be written to. However, the reset zone must be erased prior to switching to an open and active zone. A zone may be erased any time between a ZM reset and a ZM open. Upon resetting a zone, the storage device 300 may determine a new ZCAP of the reset zone and update the Writeable ZCAP attribute in the zone metadata. An offline zone is a zone that is unavailable to write data to. An offline zone may be in the full state, the empty state, or in a partially full state without being active.

Since resetting a zone clears or schedules an erasure of all data stored in the zone, the need for garbage collection of individual erase blocks is eliminated, improving the overall garbage collection process of the storage device 300. The storage device 300 may mark one or more erase blocks for erasure. When a new zone is going to be formed and the storage device 300 anticipates a ZM open, the one or more erase blocks marked for erasure may then be erased. The storage device 300 may further decide and create the physical backing of the zone upon erase of the erase blocks. Thus, once the new zone is opened and erase blocks are being selected to form the zone, the erase blocks will have been erased. Moreover, each time a zone is reset, a new order for the LBAs and the write pointer 310 for the zone 306 may be selected, enabling the zone 306 to be tolerant to receive commands out of sequential order. The write pointer 310 may optionally be turned off such that a command may be written to whatever starting LBA is indicated for the command.

Referring back to FIG. 3A, when the host sends a write command to write data to a zone 306, the controller 308 pulls-in the write command and identifies the write command as a write to a newly opened zone 306. The controller 308 selects a set of EBs to store the data associated with the write commands of the newly opened zone 306 to, and the newly opened zone 306 switches to an active zone 306. The write command may be a command to write new data, or a command to move valid data to another zone for garbage collection purposes. The controller 308 is configured to DMA read new commands from a submission queue populated by a host device.

In an empty zone 306 just switched to an active zone 306, the data is assigned to the zone 306 and the associated set of sequential LBAs of the zone 306 starting at the ZSLBA, as the write pointer 310 is indicating the logical block associated with the ZSLBA as the first available logical block. The data may be written to one or more erase blocks or NAND locations that have been allocated for the physical location of the zone 306. After the data associated with the write command has been written to the zone 306, a write pointer 310 is updated to point to the next LBA available for a host write (i.e., the completion point of the first write). The write data from this host write command is programmed sequentially into the next available NAND location in the erase block selected for physical backing of the zone.

In some embodiments, a NAND location may be equal to a wordline. In such an embodiment, if the write command is smaller than a wordline, the controller may optionally aggregate several write commands in another memory location such as DRAM or SRAM prior to programming a full wordline composed of multiple write commands. Write commands that are longer than a wordline will be able to program and fill a complete wordline with some of the data, and the excess data beyond a wordline will be used to fill the next wordline. For the purposes of this description, the write data sizes are equal to a NAND location of 512 bytes; however, this is not intended to be limiting.

For example, the controller 308 may receive a first write command to a third zone 306c, or a first zone append command. The host identifies sequentially which logical block of the zone 306 to write the data associated with the first command to. The data associated with the first command is then written to the first or next available LBA(s) in the third zone 306c as indicated by the write pointer 310, and the write pointer 310 is advanced or updated to point to the next available LBA available for a host write (i.e., WP>0). If the controller 308 receives a second write command to the third zone 306c, or a second zone append command, the data associated with the second write command is written to the next available LBA(s) in the third zone 306c identified by the write pointer 310. Once the data associated with the second command is written to the third zone 306c, the write pointer 310 once again advances or updates to point to the next available LBA available for a host write. Resetting the third zone 306c moves the write pointer 310 back to the ZGSLBA (i.e., WP=0), and the third zone 306c switches to an empty zone.

FIGS. 4A-4C and FIGS. 5A-5C illustrate a schematic block diagram of a storage device 106 generating and/or updating parity data or XOR data in either a second RAM or volatile memory, a first RAM or volatile memory, or both a first RAM or volatile memory and a second RAM or volatile memory by utilizing a temporary buffer, according to various embodiments. The phrase "XOR or parity data" is utilized throughout, and is not intended to be limiting, as other forms of data in flight may be relevant. The XOR data or parity data, deemed as data in flight, is considered the parity buffer and may protect the loss of data due to data corruption, erroneous bit transfer, power loss, and other causes of data loss. The XOR data or parity data may be generated or updated in the SRAM, and temporarily stored in the SRAM and/or DRAM before being copied to the NVM 110, for example. Furthermore, in case of power failure, capacitors (not shown) located within the storage device, such as the storage device 106 of FIG. 1, may store an adequate amount of energy to program data from the DRAM, such as the DRAM 112 of FIG. 1, to the NVM 110 to help prevent data loss, for example.

The system 100 of FIG. 1 will be used in accordance with FIGS. 4A-4C and FIGS. 5A-5C. In the following descriptions, a non-volatile storage unit 110 is referred to as a NVM, a first RAM or volatile memory 112 (i.e., a first RAM1) is referred to as DRAM, and a second RAM or volatile memory 118 (i.e., a second RAM2) is referred to as SRAM for simplification and exemplary purposes. Unwritten user or host data may comprise small lengths or amount of data (e.g., less than the size of one or more wordlines) that are stored in a parking location or buffer, such as the SRAM region 122m, until the aggregated size of the data reaches a minimum size (e.g., the size of one or more wordlines), in which case the unwritten user data is written to the NVM 110.

In FIGS. 4A-4C and FIGS. 5A-5C, parity data or XOR data is denoted by "Wxx" where "x" represents the write ID of an associated command. XOR data may be stored in either a SRAM region 122a-122n or a DRAM region 116a-116n or both in a SRAM region 122a-122n and a DRAM region 116a-116n. Furthermore, in the embodiments discussed below, SRAM region 122n is a temporary buffer or "scratch pad" so that XOR data is initially written to the temporary SRAM region 122n prior to updating previous XOR data or parity data already existing in a SRAM region 122a-122n-1, a DRAM region 116a-116n, or both a SRAM region 122a-122n-1 and a DRAM region 116a-116n. While the last SRAM region 122n is used as the temporary buffer or "scratch pad", any SRAM region 122a-122n may be used. A SRAM region 122a-122n and a DRAM region 116a-116n may be any suitable size, such as 512 bytes, as described above.

Parity or XOR data included in the data in flight may further be denoted by either an asterisk (*) or a single quotation or prime mark ('). An asterisk (*) signifies that the new XOR data for a zone has been pushed from the XOR engine 124 to the SRAM 118, but has not yet updated a SRAM region 122a-122n-1 storing related XOR or parity data for the zone. A single quotation or prime mark (') refers to an updated XOR or parity data within either a SRAM region 122a-122n or a DRAM region 116a-116n, or both a SRAM region 122a-122n and a DRAM region 116a-116n, that has been updated with the new parity or XOR data stored in the temporary SRAM region 122n.

As write commands are transferred to the storage device 106, the data is both written to the non-volatile memory 110 and read at the XOR engine 124. In one embodiment, the XOR engine 124 generates XOR data or parity data that is written either to the temporary SRAM region 122n if existing corresponding parity data exists in either the SRAM 118, DRAM 112, or both the SRAM 118 and DRAM 112, or to an available SRAM region 122a-122n-1 if no existing corresponding parity data exists in either SRAM 118, DRAM 112, or both SRAM 118 and DRAM 112. In another embodiment, the XOR engine 124 generates XOR data or parity data that is written to the temporary SRAM region 122n regardless if XOR data or parity data exists for the corresponding zone. XOR data and parity data may be used interchangeably to describe the same data.

The data transfer speed to the NVM 110 due to potential limitations of the TM bus 128 may be slower than the write speed from either the XOR engine 124 to the SRAM 118, from the DRAM 112 to the SRAM 118, or from both XOR engine 124 to the SRAM 118 and from the DRAM 112 to the SRAM 118. Since the data transfer speed to the NVM 110 due to potential limitations of the TM bus 128 may be the limiting factor, numerous small commands may cause a bottleneck to occur while writing the data to the NVM 110 and simultaneously generating or updating the corresponding parity data. However, in some cases, the data transfer speed of the SRAM 118 and/or the DRAM 112 may be the limiting factor. If the host is restricted to have a minimum write size before initiating a write sequence to a zone of a storage device 106, the programming speeds of the NVM 110, DRAM 112, and SRAM 118 can be rate matched, eliminating the bottleneck. Thus, the overall writing process may not be hindered due to different programming rates.

The time it takes to write data to either the NVM 110, the SRAM 118 from the DRAM 112, or the XOR engine 124 to the SRAM 118 is dependent on the program speed and the amount of data to be written. For example, the following equations where time1>time2, (write data command length)/(storage program speed)=time1, (inflight data size)/(data transfer speed)=time2, (data command length)>=(inflight data size)/(data transfer speed)*(storage program speed), may describe the time it takes for data to be written to the NVM 110. The program speed or the data transfer speed is dependent on the transfer speed associated with each memory type. Furthermore, additional variables, such as the TM bus transfer speed to a NVM 110 location, such as a parking location, the DRAM 112 read time, or a combination of the various bottleneck impactors and access overheads for each memory type, may impact the program speed or the transfer speed of each memory or media type. The SRAM 118, DRAM 112, and NVM 110 may each have differing program speeds. By setting a minimum write size for the host, the time it takes for data to be written to the NVM 110, data to be transferred from the DRAM 112 to the SRAM 118, and data to be transferred from XOR engine 124 to SRAM 118 equal to each other (i.e., rate matching the programming speeds). In one embodiment, the minimum write size is about 1MiB or greater. The minimum write size concept may be applied when referring to copying data, writing data, or generating XOR or parity data in FIGS. 4A-4C.

Figure 4A:
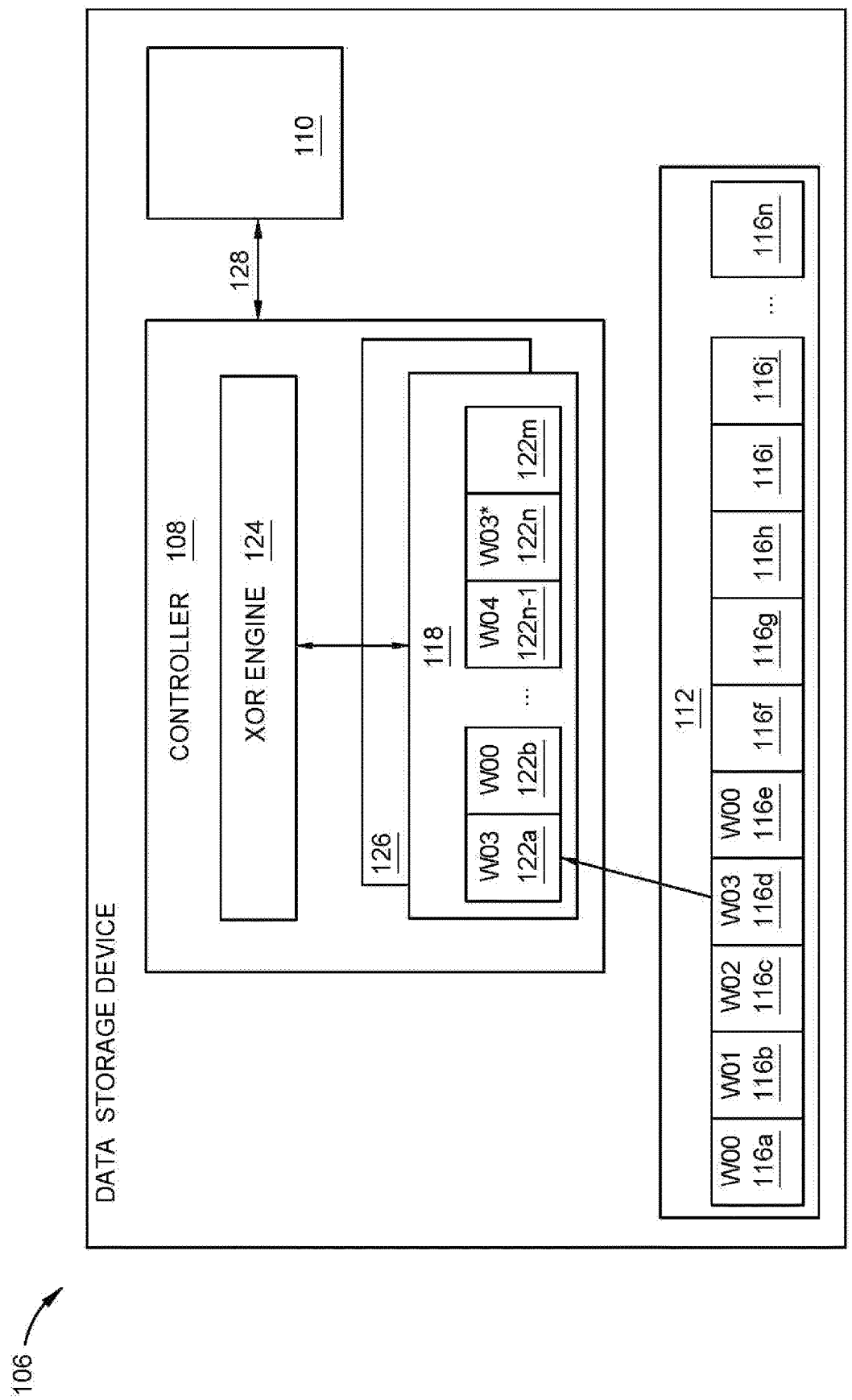
FIGS. 4A-5C illustrate a schematic block diagram of generating and/or updating parity data or XOR data in either SRAM, DRAM, or both SRAM and DRAM by utilizing a temporary buffer, according to various embodiments.

In FIG. 4A, first parity data W03 or XOR data associated with a first zone of a plurality of zones, such as a first zone 306a of FIG. 3A, is stored in the fourth DRAM region 116d. The storage device 106 may receive a first write command to write data that satisfies the minimum write size to the first zone, such as zone 306a of FIG. 3A, from the host. As the data is written to the NVM 110, the XOR engine 124 generates new first parity data W03* or XOR data associated with the first write command.

The new first parity data W03* associated with the first command is written to the temporary SRAM region 122n. While the new first parity data W03* is stored and updated at the temporary SRAM region 122n, the corresponding previously generated parity or XOR data W03 existing in a DRAM region 116a-116n, such as the fourth DRAM region 116d, is copied to an available SRAM region 122a-122n-1, such as the first SRAM region 122a. If all SRAM regions 122a-122n-1 are currently storing data associated with other zones, the controller 108 or XOR engine 124 will erase the data in a SRAM region 122a-122n-1 that contains the oldest data.

Figure 4B:
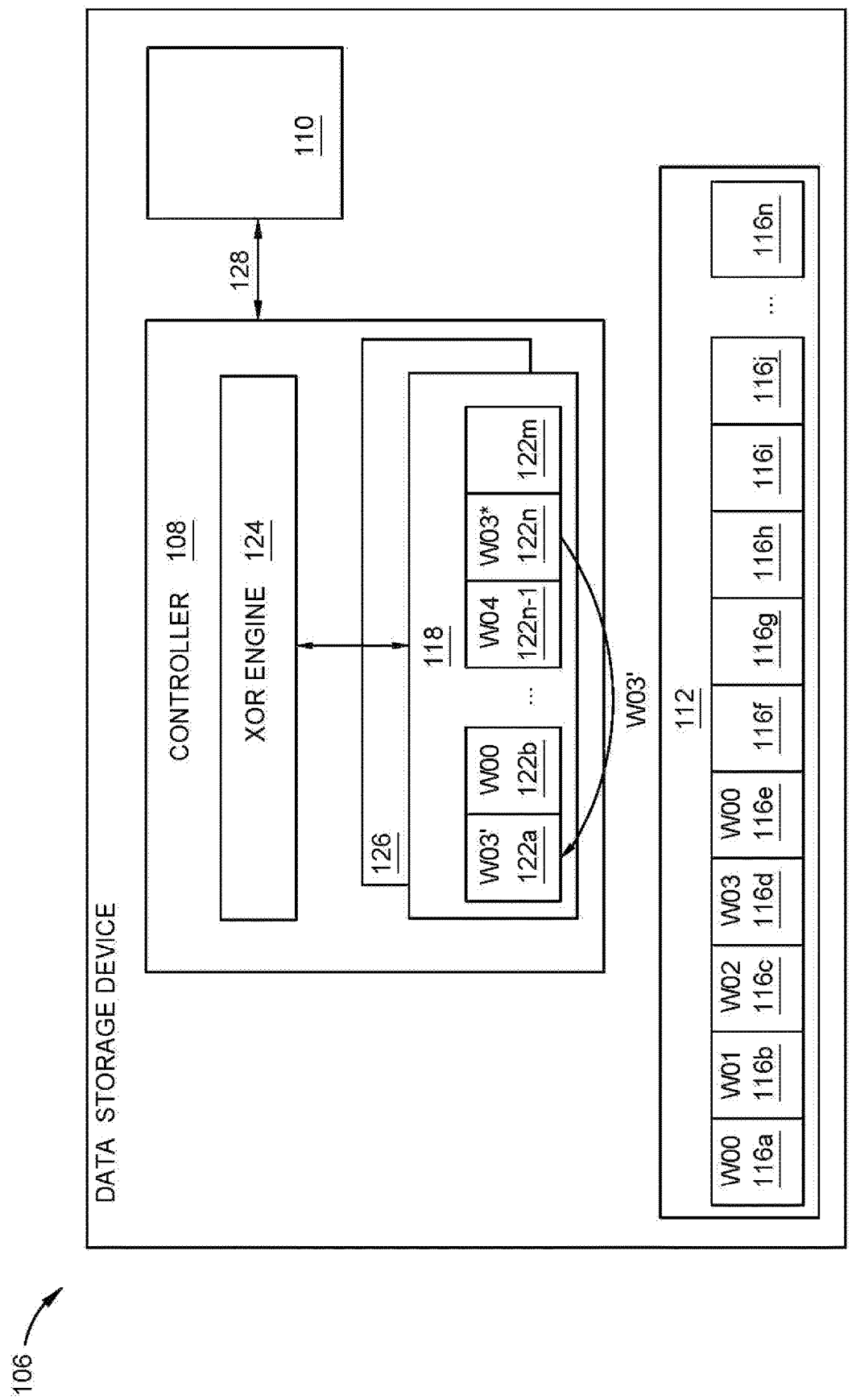

In FIG. 4B, after the previously generated first parity data W03 is copied from the fourth DRAM region 116d to the first SRAM region 122a, the previously generated first parity data W03 is updated with the corresponding new parity data W03* at the first SRAM region 122a to become updated first parity data W03'. Thus, the updated first parity data W03' comprises any previously generated parity or XOR data for the first zone, as well as the new parity or XOR data associated with the data of the first write command. The previously generated first parity data W03 may be updated with the new first parity data W03* in either the first SRAM region 122a where the previously generated first parity data W03 is currently stored, as shown in FIG. 4B, or in the temporary SRAM region 122n. The update of the first parity data W03' or XOR data occurs simultaneously with the write to the first zone in the NVM 110.

Figure 4C:
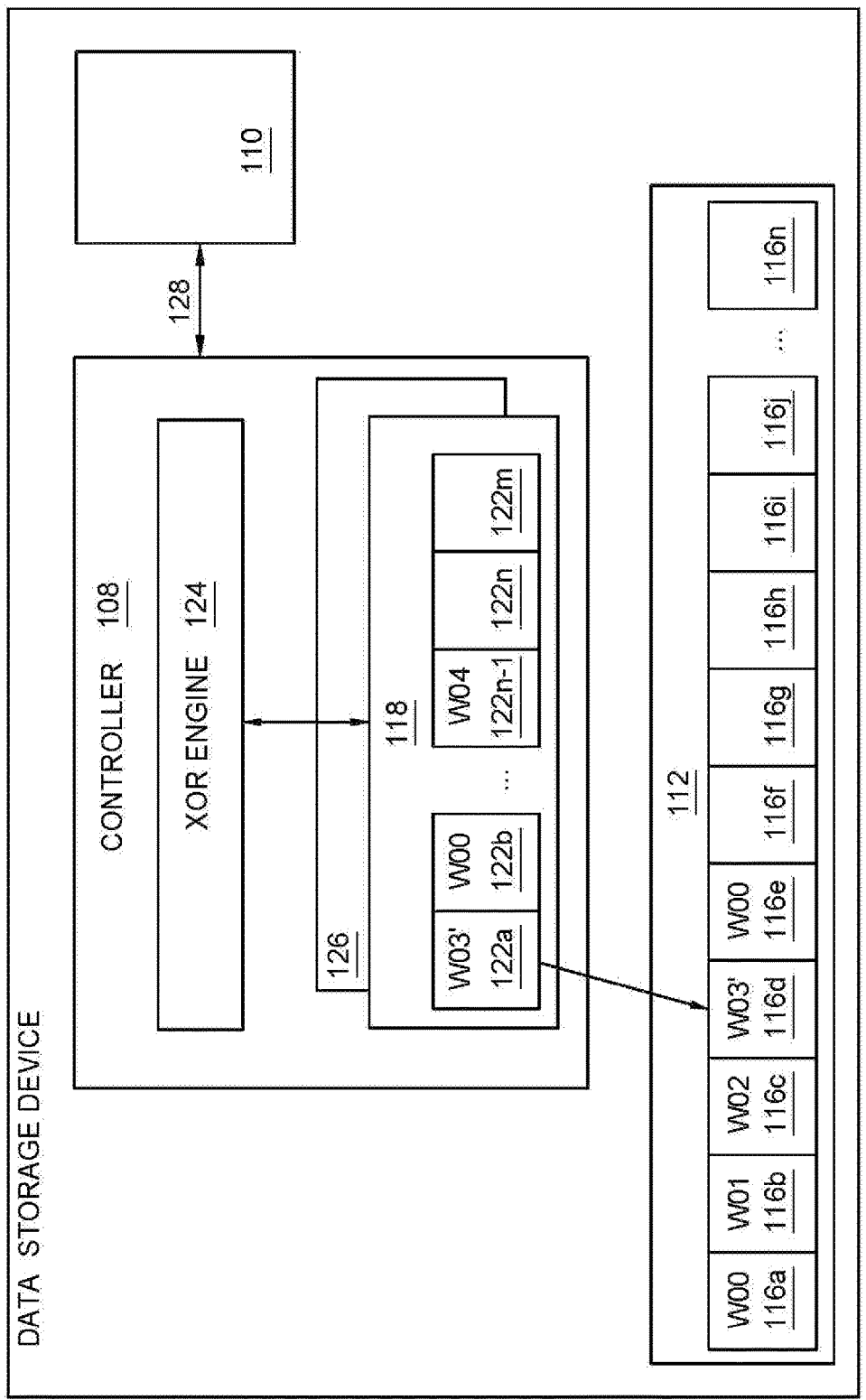

In FIG. 4C, the updated first parity data W03' or XOR data is copied or re-written to the fourth DRAM region 116d. The updated first parity data W03' is rewritten over the previously generated first parity data W03 in the fourth DRAM region 116d. However, parity or XOR data may be written to any DRAM region 116a-116n, sequentially or non-sequentially. In other words, if XOR or parity data associated with a first zone, such as zone 306a of FIG. 3A, is stored in a fourth DRAM region 116d, the new XOR or parity data for the first zone may either be re-written in the fourth DRAM region 116d, or the new XOR or parity data may be written to a new SRAM region, such as a sixth SRAM region 116f. After the updated first XOR or parity data W03' is successfully copied or re-written to a DRAM region 116a-116n, the new first parity data W03* stored in the temporary SRAM region 122n is erased and becomes available to store new XOR data or parity data associated with a write command to write data to another zone.

Due to the minimum write size requirement, the write to the NVM 110 may complete at the same time as the write to a SRAM region 122a-122n, the update of parity data or XOR data in a SRAM region 122a-122n, and the write to a DRAM region 116a-116n. Thus, the first write command to the first zone in the NVM 110 may be completed when the updated parity data W03' or XOR data is re-written to a DRAM region 116d.

Figure 5A:
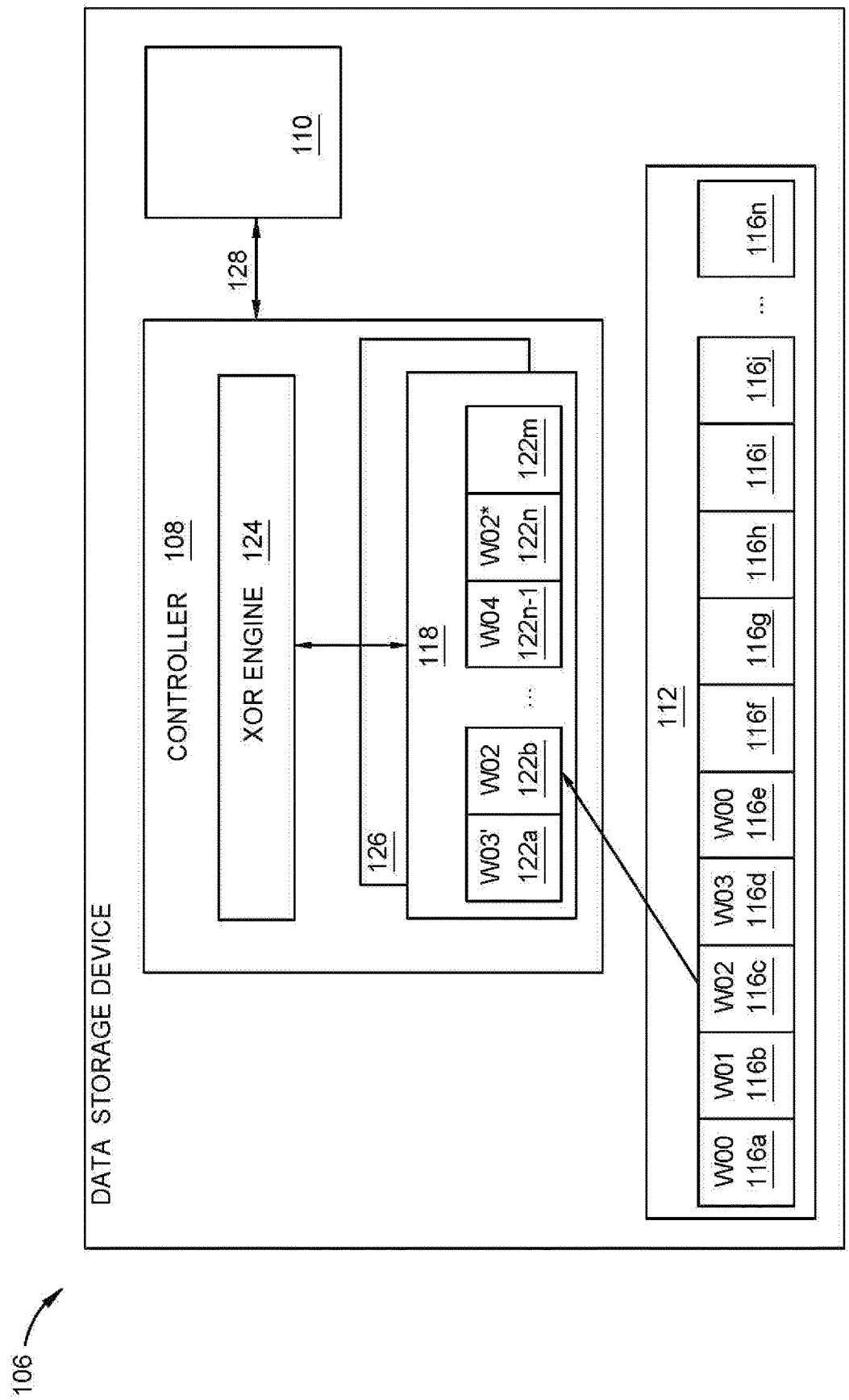

FIG. 5A illustrates second parity data W00 associated with a second zone, such as zone 306b of FIG. 3A, currently stored in the second SRAM region 122b, and previously generated third parity data W02 or XOR data associated with a third zone, such as zone 306c of FIG. 3A, is stored in the third DRAM region 116c. The storage device 106 then receives a second write command to write data that satisfies the minimum write size to the third zone from the host. The storage device 106 then determines that the second parity data W00 is currently the oldest parity data being stored in the SRAM 118, and erases the second parity data W00 from the second SRAM region 122b. As the data associated with the second command is written to the NVM 110, the XOR engine 124 generates new third parity data W02* or XOR data associated with the second write command in the temporary SRAM region 122n.

While the new third parity data W02* is updated and stored at the temporary SRAM region 122n, the corresponding previously generated third parity or XOR data W02 existing in the third DRAM region 116c is copied to the newly erased second SRAM region 122b.

Figure 5B:
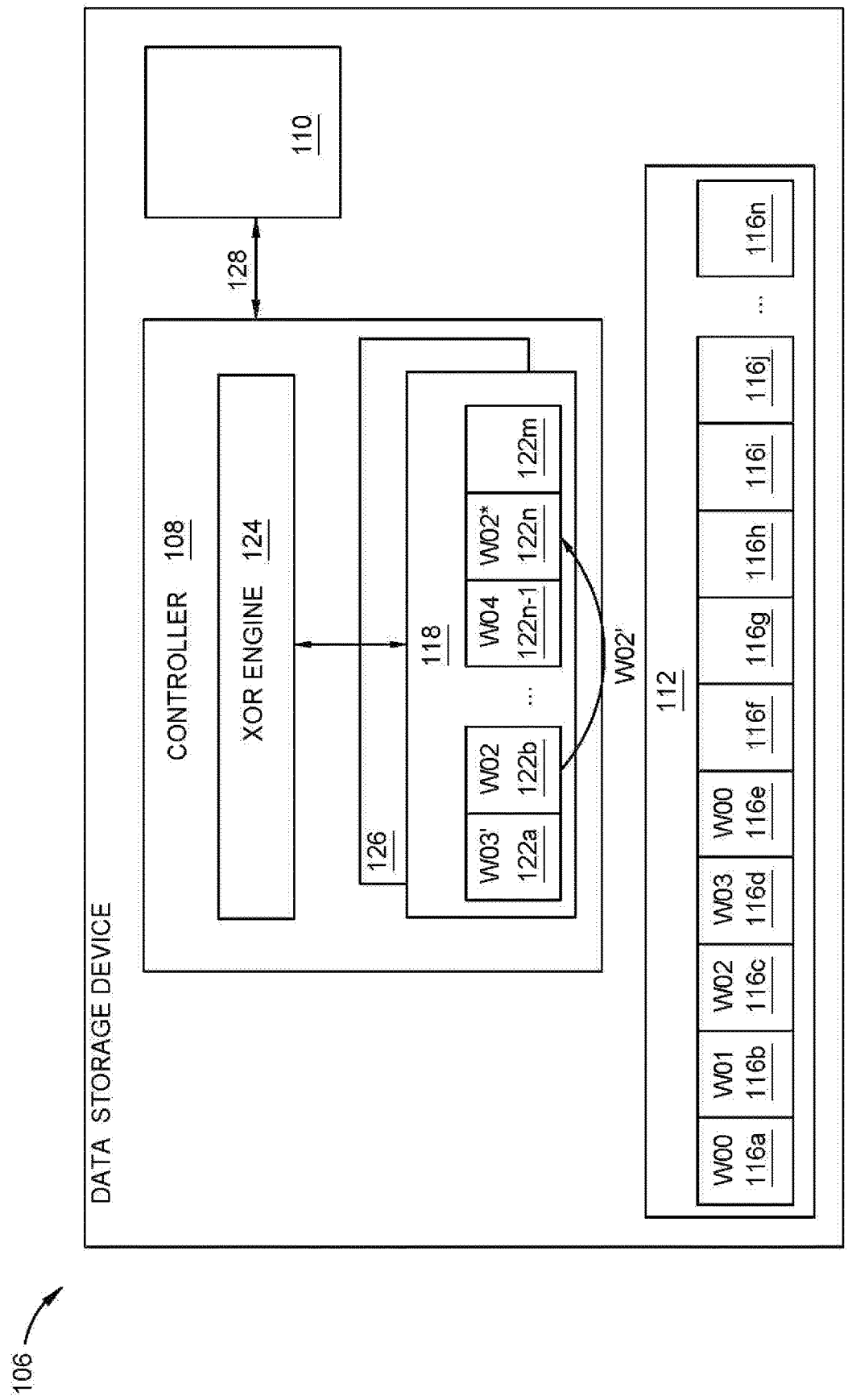

In FIG. 5B, after the previously generated third parity data W02 is copied from the third DRAM region 116c to the second SRAM region 122b, the previously generated third parity data W02 is updated with the corresponding new third parity data W02* at the temporary SRAM region 122n to become updated third parity data W02'. Thus, the updated third parity data W02' comprises any previously generated parity or XOR data for the third zone, as well as the new parity or XOR data associated with the data of the second write command. The previously generated third parity data W02 may be updated with the new third parity data W02* in either the second SRAM region 122b where the previously generated third parity data W02 is currently stored, as shown in FIG. 5B, or in the temporary SRAM region 122n, as shown in FIG. 5B. The update of the second parity data W02' or XOR data occurs simultaneously with the write to the second zone in the NVM 110.

Figure 5C:
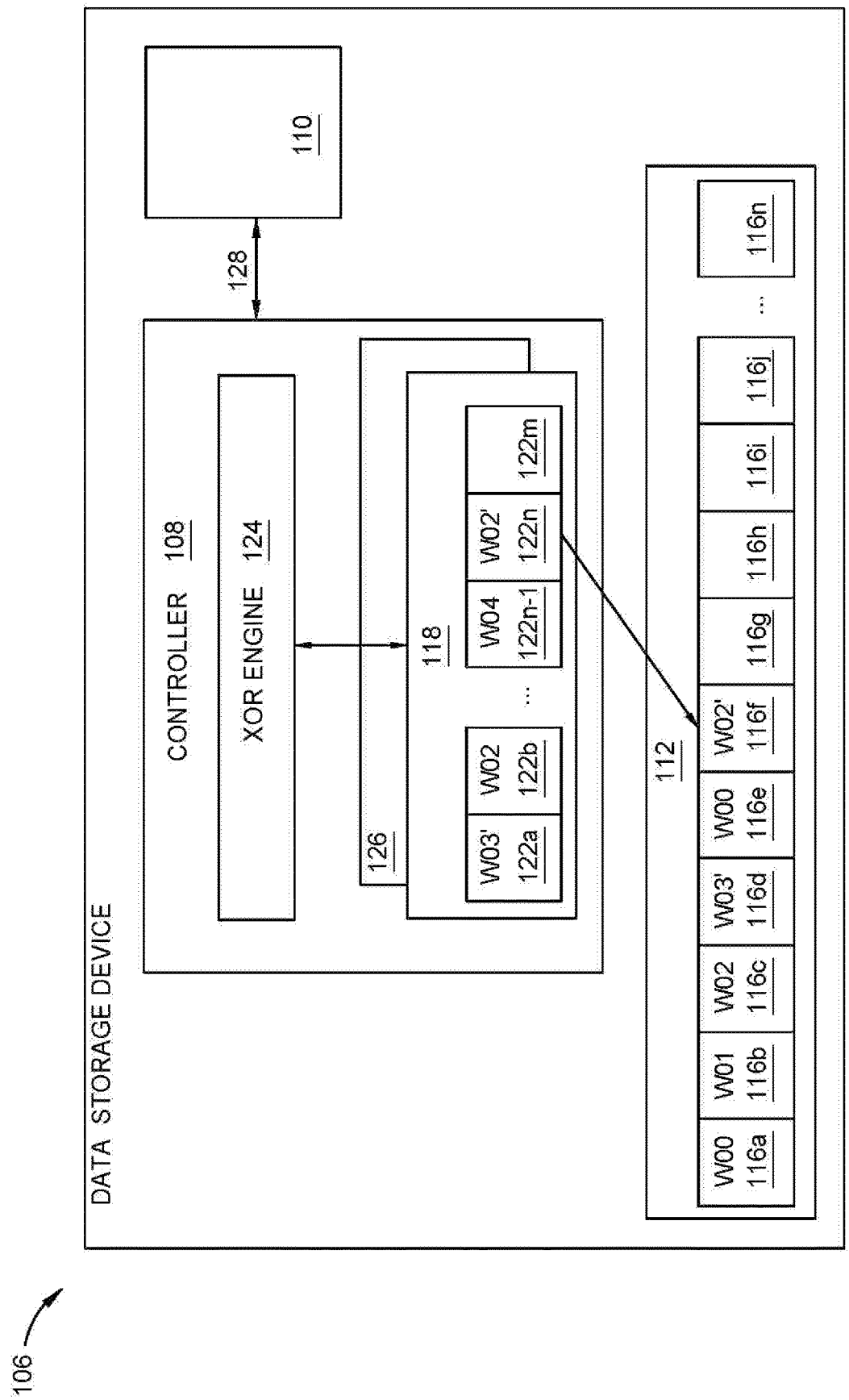

FIG. 5C illustrates the updated third parity data or XOR data W02' being copied or re-written to the sixth DRAM region 116f. However, parity or XOR data may be written to any DRAM region 116a-116n, sequentially or non-sequentially. In other words, if XOR or parity data associated with a third is stored in a third DRAM region 116c, new XOR or parity data for the third zone, such as zone 306c of FIG. 3A, may either be re-written in the third DRAM region 116c, or the new XOR or parity data for the third zone may be written to a new SRAM region, such as a tenth SRAM region 116j. After the updated third XOR or parity data W02' is successfully copied or re-written to a DRAM region 116a-116n, the new third parity data W02' stored in the temporary SRAM region 122n is erased and becomes available to store new XOR data or parity data associated with a new write command to write data to another zone.

Due to the minimum write size requirement, the write to NVM 110 may complete at the same time as the write to a SRAM region 122a-122n, the update of parity data or XOR data in a SRAM region 122a-122n, and the write to a DRAM region 116a-116n. Thus, the second write command to the second zone in the NVM 110 may be completed when the updated parity data W02' or XOR data is re-written to a DRAM region 116f.

In order to protect the loss of data on a storage drive, parity data or XOR data is created utilizing a XOR engine. The parity or XOR data is then written to the SRAM from the XOR engine. The parity or XOR data may be copied to the DRAM from the SRAM, pulled from the DRAM to the SRAM to be updated, or updated within the SRAM from a new write command from the XOR engine pertaining to the same parity data. By restricting the host to have a minimum write size, the data transfer speed to DRAM, SRAM, and the memory unit can be optimized. A temporary buffer is utilized within the SRAM to update XOR data for the corresponding commands in a quicker and more efficient manner. As such, by setting a minimum data transfer size, the efficiency of updating parity information may be optimized to allow for a smoother and more consistent data transfer.

In one embodiment, a storage device comprises a non-volatile storage unit. The capacity of the non-volatile storage unit is divided into a plurality of zones. The non-volatile storage unit comprises a plurality of dies, each of the plurality of dies comprises a plurality of erase blocks. The storage device further comprises a first volatile memory unit, a controller coupled to the non-volatile storage unit and the first volatile memory unit, and a controller comprising a second volatile memory unit. The controller is configured to set a minimum write size for commands to write data received from a host device and receive one or more commands to write data in the minimum write size to one or more zones of the plurality of zones. The controller is further configured to generate new first parity data for a first zone of the plurality of zones in a temporary location in the second volatile memory unit and copy previous first parity data for the first zone from the first volatile memory unit to a first location in the second volatile memory unit. The controller is further configured to update the previous first parity data with the new first parity data in the second volatile memory unit.

Regarding the storage device, the previous first parity data is updated with the new first parity data in the first location in the second volatile memory unit. Furthermore, the previous first parity data is updated with the new first parity data in the temporary location in the second volatile memory unit. The minimum write size is based on a program time of writing the data associated with the one or more commands to the one or more zones. The minimum write size is based on a transfer speed for copying the previous first parity data from the first volatile memory unit to the second volatile memory unit. The minimum write size is based on an amount of time it takes to generate the new first parity data. Furthermore, the controller is further configured to copy the updated first parity data from the second volatile memory unit to the first volatile memory unit, and erase the temporary location in the second volatile memory unit after the previous first parity data is updated with the new first parity data.

In another embodiment, a storage device comprises a non-volatile storage unit. The capacity of the non-volatile storage unit is divided into a plurality of zones. The non-volatile storage unit comprises a plurality of dies, each of the plurality of dies comprises a plurality of erase blocks. The storage device further comprises a first volatile memory unit, a controller coupled to the non-volatile storage unit and the first volatile memory unit, and a controller comprising a second volatile memory unit. The controller is configured to receive a first command to write data in a minimum write size to a first zone of the plurality of zones, and simultaneously, generate new first parity data for the first zone in a temporary location in the second volatile memory unit, where the new first parity data is associated with the first command, write the data associated with the first command to the first zone, and copy previous first parity data for the first zone from the first volatile memory unit to a first location in the second volatile memory unit.

The controller is also configured to update the previous first parity data with the new first parity data in the first location in the second volatile memory unit, erase the temporary location in the second volatile memory unit. The controller is further configured to receive a second command to write data in the minimum write size to a second zone, and simultaneously, generate new second parity data for the second zone in the temporary location in the second volatile memory unit, where the new second parity data is associated with the second command, write the data associated with the second command to the second zone, and copy previous second parity data for the second zone from the first volatile memory unit to a second location in the second volatile memory unit. The controller is also configured to update the previous second parity data with the new second parity data in the temporary location in the second volatile memory unit.

The controller is further configured to copy the updated first parity data from the second volatile memory unit to the first volatile memory unit after updating the previous first parity data with the new first parity data. The controller is further configured to copy the updated second parity data from the second volatile memory unit to the first volatile memory unit after updating the previous second parity data with the new second parity data. The minimum write size is selected by the storage device to match a program time of writing the data associated with the one or more commands to the plurality of zones to a transfer speed for copying previous parity data from the first volatile memory unit to the second volatile memory unit. The minimum write size is about 1 MiB or greater. The controller comprises an XOR engine configured to generate the first parity data and update the second parity data. The first volatile memory unit is a DRAM unit, and the second volatile memory unit is a SRAM unit.

In another embodiment, a storage device comprises a non-volatile storage unit, wherein the capacity of the non-volatile storage unit is divided into a plurality of zones. The non-volatile storage unit is comprised of a plurality of dies and each of the plurality of dies comprises a plurality of erase blocks. The storage device further comprises a DRAM unit, a controller coupled to the non-volatile storage unit and the DRAM unit, and a controller comprising a SRAM unit. The controller is configured to receive one or more commands to write data to one or more zones of the plurality of zones, wherein the data associated with the one or more commands are restricted to a minimum write size. The controller is also configured to generate new first parity data for a first zone in a temporary location in the SRAM unit, where the new first parity data is associated with a first command received in the minimum write size, and write the data associated with the first command to the first zone simultaneously. The controller is further configured to erase a first location in the SRAM unit, copy previous first parity data for the first zone from the DRAM unit to the first location in the SRAM unit, and combine the previous first parity data with the new first parity data in the SRAM memory unit. The controller is also configured to copy the combined first parity data from the SRAM unit to a first location in the DRAM unit. The minimum write size is rate matched to a program time of writing the data associated with the one or more commands to the one or more zones, a transfer speed for copying previous parity data from the DRAM unit to the SRAM unit, or an amount of time it takes to generate new parity data.

The minimum write size is about 1 MiB or greater. The minimum write size is based on an amount of time it takes to generate the new first parity data. The controller is further configure to calculate and determine the minimum write size for commands to write data received from a host device. The controller is further configured to erase the temporary location in the SRAM unit after copying the combined first parity data from the SRAM memory unit to the DRAM unit. The controller is further configured to receive a second command to write data in the minimum write size to the first zone, and simultaneously, update the combined first parity data for the first zone in the first location in the SRAM unit The controller is configured to write the data associated with the second command to the first zone, and copy the updated combined first parity data from the SRAM unit to the first location in the DRAM unit.

While the foregoing is directed to embodiments of the present disclosure, other and further embodiments of the disclosure may be devised without departing from the basic scope thereof, and the scope thereof is determined by the claims that follow.

What is claimed is:
1. A storage device, comprising:
a non-volatile storage unit, wherein a capacity of the non-volatile storage unit is divided into a plurality of zones, and wherein the non-volatile storage unit comprises a plurality of dies, each of the plurality of dies comprising a plurality of erase blocks;
a first volatile memory unit; and a controller coupled to the non-volatile storage unit and the first volatile memory unit, the controller comprising a second volatile memory unit, wherein the controller is configured to:
  set a minimum write size for commands to write data received from a host device;
  receive one or more commands to write data in the minimum write size to one or more zones of the plurality of zones;
  generate new first parity data for a first zone of the plurality of zones in a temporary location in the second volatile memory unit;
  copy previous first parity data for the first zone from the first volatile memory unit to a first location in the second volatile memory unit; and
  update the previous first parity data with the new first parity data in the second volatile memory unit.

2. The storage device of claim 1, wherein the previous first parity data is updated with the new first parity data in the first location in the second volatile memory unit.

3. The storage device of claim 1, wherein the previous first parity data is updated with the new first parity data in the temporary location in the second volatile memory unit.

4. The storage device of claim 1, wherein the minimum write size is based on a program time of writing the data associated with the one or more commands to the one or more zones.

5. The storage device of claim 1, wherein the minimum write size is based on a transfer speed for copying the previous first parity data from the first volatile memory unit to the second volatile memory unit.

6. The storage device of claim 1, wherein the minimum write size is based on an amount of time it takes to generate the new first parity data.

7. The storage device of claim 1, wherein the controller is further configured to:
  copy the updated first parity data from the second volatile memory unit to the first volatile memory unit; and
  erase the temporary location in the second volatile memory unit after the previous first parity data is updated with the new first parity data.

8. A storage device, comprising:
a non-volatile storage unit, wherein a capacity of the non-volatile storage unit is divided into a plurality of zones, and wherein the non-volatile storage unit comprises a plurality of dies, each of the plurality of dies comprising a plurality of erase blocks;
a first volatile memory unit; and
a controller coupled to the non-volatile storage unit and the first volatile memory unit, the controller comprising a second volatile memory unit, wherein the controller is configured to:
  receive a first command to write data in a minimum write size to a first zone of the plurality of zones;
  simultaneously, generate new first parity data for the first zone in a temporary location in the second volatile memory unit, the new first parity data being associated with the first command, write the data associated with the first command to the first zone, and copy previous first parity data for the first zone from the first volatile memory unit to a first location in the second volatile memory unit;
  update the previous first parity data with the new first parity data in the first location in the second volatile memory unit;
  erase the temporary location in the second volatile memory unit;
  receive a second command to write data in the minimum write size to a second zone;
  simultaneously, generate new second parity data for the second zone in the temporary location in the second volatile memory unit, the new second parity data being associated with the second command, write the data associated with the second command to the second zone, and copy previous second parity data for the second zone from the first volatile memory unit to a second location in the second volatile memory unit; and
  update the previous second parity data with the new second parity data in the temporary location in the second volatile memory unit.

9. The storage device of claim 8, wherein the controller is further configured to copy the updated first parity data from the second volatile memory unit to the first volatile memory unit after updating the previous first parity data with the new first parity data.

10. The storage device of claim 8, wherein the controller is further configured to copy the updated second parity data from the second volatile memory unit to the first volatile memory unit after updating the previous second parity data with the new second parity data.

11. The storage device of claim 8, wherein the minimum write size is selected by the storage device to match a program time of writing the data associated with the one or more commands to the plurality of zones to a transfer speed for copying previous parity data from the first volatile memory unit to the second volatile memory unit.

12. The storage device of claim 11, wherein the minimum write size is about 1 MiB or greater.

13. The storage device of claim 8, wherein the controller comprises an XOR engine configured to generate the first parity data and update the second parity data.

14. The storage device of claim 8, wherein the first volatile memory unit is a DRAM unit, and wherein the second volatile memory unit is a SRAM unit.

15. A storage device, comprising:
a non-volatile storage unit, wherein a capacity of the non-volatile storage unit is divided into a plurality of zones, and wherein the non-volatile storage unit comprises a plurality of dies, each of the plurality of dies comprising a plurality of erase blocks;
a DRAM unit; and
a controller coupled to the non-volatile storage unit and the DRAM unit, the controller comprising a SRAM unit, wherein the controller is configured to:
  receive one or more commands to write data to one or more zones of the plurality of zones, wherein the data associated with the one or more commands are restricted to a minimum write size;
  generate new first parity data for a first zone in a temporary location in the SRAM unit, the new first parity data being associated with a first command received in the minimum write size, and write the data associated with the first command to the first zone simultaneously;
  erase a first location in the SRAM unit;
  copy previous first parity data for the first zone from the DRAM unit to the first location in the SRAM unit;
  combine the previous first parity data with the new first parity data in the SRAM unit; and
  copy the combined first parity data from the SRAM unit to a first location in the DRAM unit,
  wherein the minimum write size is rate matched to a program time of writing the data associated with the one or more commands to the one or more zones, a transfer speed for copying previous parity data from the DRAM unit to the SRAM unit, or an amount of time it takes to generate new parity data.

16. The storage device of claim 15, wherein the minimum write size is about 1 MiB or greater.

17. The storage device of claim 15, wherein the minimum write size is further based on an amount of time it takes to generate the new first parity data.

18. The storage device of claim 15, wherein the controller is further configure to calculate and determine the minimum write size for commands to write data received from a host device.

19. The storage device of claim 15, wherein the controller is further configured to erase the temporary location in the SRAM unit after copying the combined first parity data from the SRAM unit to the DRAM unit.

20. The storage device of claim 15, wherein the controller is further configured to:
receive a second command to write data in the minimum write size to the first zone;
simultaneously, update the combined first parity data for the first zone in the first location in the SRAM unit, and write the data associated with the second command to the first zone; and
copy the updated combined first parity data from the SRAM unit to the first location in the DRAM unit.

* * * * *